United States Patent [19]

Robertson et al.

[11] Patent Number: 5,380,566
[45] Date of Patent: Jan. 10, 1995

[54] METHOD OF LIMITING STICKING OF BODY TO SUSCEPTOR IN A DEPOSITION TREATMENT

[75] Inventors: Robert Robertson, Palo Alto; Marc M. Kollrack, Alameda; Angela T. Lee, Sunnyvale; Kam Law, Union City; Dan Maydan, Los Altos Hills, all of Calif.

[73] Assignee: Applied Materials, Inc., Santa Clara, Calif.

[21] Appl. No.: 80,018

[22] Filed: Jun. 21, 1993

[51] Int. Cl.⁶ ............................................. B05D 3/06
[52] U.S. Cl. ..................... 427/534; 427/535; 427/569; 156/643
[58] Field of Search ............... 427/534, 535, 536, 537, 427/538, 539, 569; 156/643

[56] References Cited

U.S. PATENT DOCUMENTS

| | | | |
|---|---|---|---|
| 4,391,843 | 7/1983 | Kaganowicz et al. | 427/535 |
| 4,410,586 | 10/1983 | Ladizeshy et al. | 427/536 |
| 4,436,761 | 3/1984 | Hayashi et al. | 427/535 |
| 4,745,031 | 5/1988 | Nakayama et al. | 427/535 |
| 4,762,803 | 8/1988 | Sato et al. | 427/535 |
| 4,766,006 | 8/1988 | Gaczi | 427/535 |
| 5,011,705 | 4/1991 | Tanaka | 427/534 |
| 5,017,939 | 5/1991 | Brar et al. | 427/534 |
| 5,075,256 | 12/1991 | Wang et al. | 427/534 |
| 5,135,775 | 8/1992 | Foller et al. | 427/535 |
| 5,223,457 | 6/1993 | Mintz et al. | 427/534 |

FOREIGN PATENT DOCUMENTS

| | | | |
|---|---|---|---|
| 324523 | 7/1989 | European Pat. Off. | 427/534 |
| 329845 | 8/1989 | European Pat. Off. | 427/534 |
| 6156760 | 12/1981 | Japan | 427/534 |
| 2143430 | 6/1987 | Japan | 427/534 |
| 3241185 | 10/1988 | Japan | 427/534 |

*Primary Examiner*—Marianne Padgett
*Attorney, Agent, or Firm*—Donald S. Cohen

[57] ABSTRACT

A method of limiting sticking of a body (substrate) to a susceptor after the body has been coated with a layer in a deposition chamber by plasma chemical vapor deposition includes subjecting the coated body to a plasma of an inactive gas, e.g., hydrogen, nitrogen, argon or ammonia, which does not adversely affect the coating and does not add additional layers to the body. After the coated body is subjected to the plasma of the inactive gas, the body is separated from the susceptor.

19 Claims, 1 Drawing Sheet

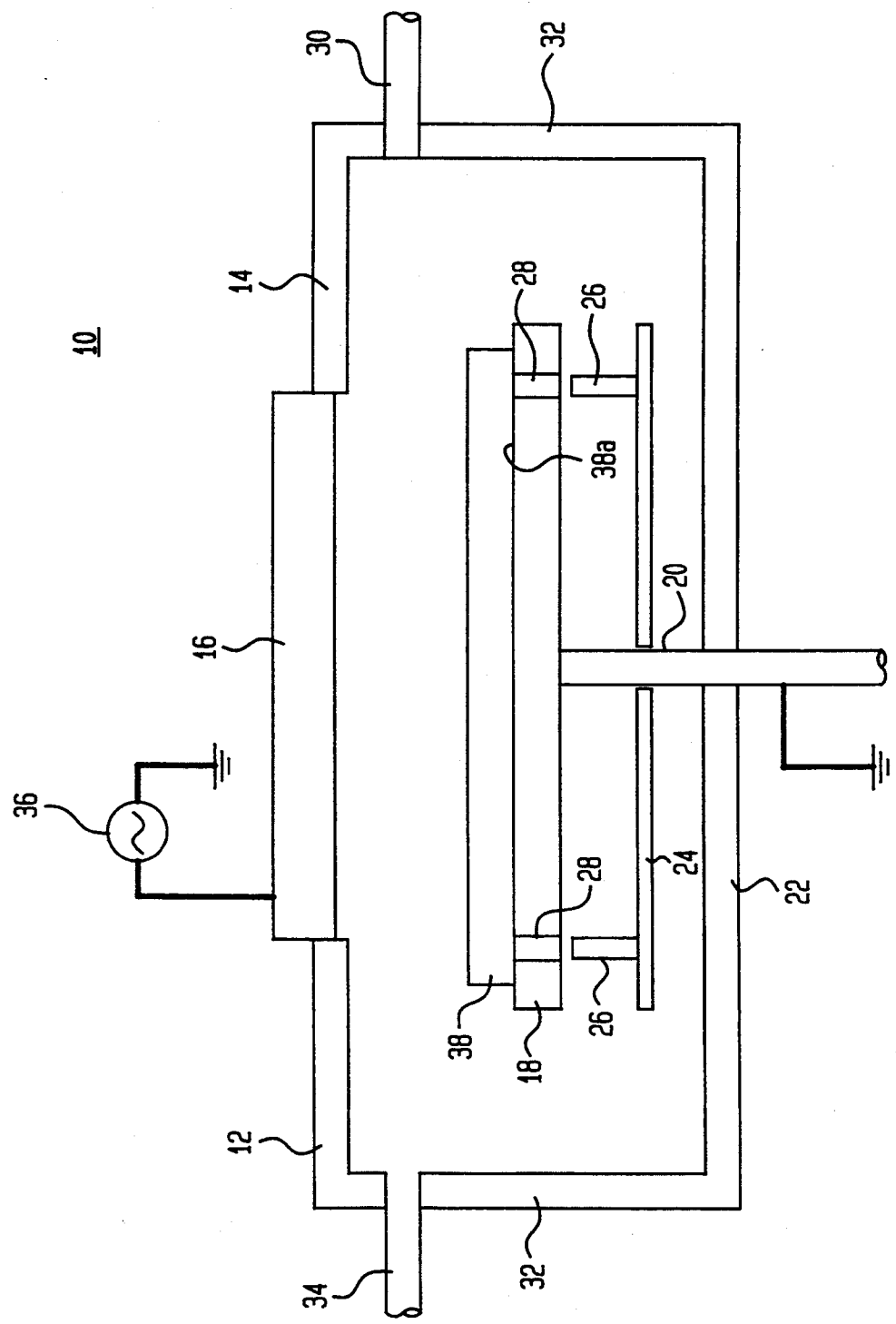

METHOD OF LIMITING STICKING OF BODY TO SUSCEPTOR IN A DEPOSITION TREATMENT

FIELD OF THE INVENTION

The present invention is directed to a method of improving the lifting of a body off a susceptor in a plasma processing (deposition) apparatus, and, more particularly, to a method of reducing sticking of a body to the susceptor in a plasma deposition apparatus to permit ease of lift-off of the body from the susceptor.

BACKGROUND OF THE INVENTION

Plasma chemical vapor deposition (CVD) is a process used for the deposition of layers of various materials on a body, particularly in the manufacture of semiconductor devices and the like formed on an insulating body, such as glass or a semiconductor wafer. A plasma CVD apparatus comprises, in general, a deposition chamber, a pair of spaced electrodes with at least one of the electrodes being in the deposition chamber, and a susceptor in the deposition chamber and between the electrodes for supporting the body to be coated. The susceptor may also serve as one of the electrodes. Means are provided to achieve a flow of a deposition gas into the deposition chamber, and a power source is connected to the electrodes for providing a sufficient amount of radio frequency (rf) power to create a plasma in the deposition gas. For commercial production, plasma CVD apparatus also typically comprises means for automatically transferring the bodies being coated into the deposition chamber and onto the susceptor and for removing the coated bodies from the susceptor and the deposition chamber. The transfer means generally includes fingers for lifting the coated bodies from the susceptor. Also, the susceptor generally moves vertically upwardly to receive a body to be coated and then vertically downwardly as the fingers lift the coated body therefrom.

A problem which has been discovered in the operation of a plasma CVD apparatus is that the bodies have a tendency to stick to the susceptor. It is believed that this sticking is the result of an electrostatic charge which attaches to the body and the susceptor during the plasma deposition process. This makes it more difficult to remove the coated bodies from the susceptor without damaging the bodies. In fact, the sticking has caused the bodies to break as they are lifted off of the susceptor.

SUMMARY OF THE INVENTION

The present invention is directed to a method of limiting sticking of a body to a susceptor as a result of processing a surface of the body by plasma chemical vapor processing. During the processing, the body is mounted on the susceptor in a processing chamber and is processed, such as by applying a coating to the body. The method of the present invention comprises, after the body is processed, subjecting the body to a plasma of an inactive gas which does not adversely affect the coating on the body and which does not cause a layer of a material to be deposited on the body or coating. The method also includes, after the body is subjected to the plasma for a short period of time, separating the body from the susceptor to permit removal of the body from the deposition chamber.

Viewed from another aspect, the present invention is directed to a method of treating a body. The method comprises a first step of placing the body on a susceptor within a deposition chamber having an electrode spaced from the susceptor. In a second step, a flow of deposition gas is provided within the chamber; and, in a third step, a voltage is provided between the electrode and the susceptor at a rf power which generates a plasma in the deposition gas so as to cause the deposition gas to react and deposit a layer on a surface of the body. After discontinuing the flow of the deposition gas, a fourth step comprises providing a flow of an inactive gas in the deposition chamber. The inactive gas is a gas which does not adversely affect the layer on the body and which does not cause a layer of material to be deposited on the body. In a fifth step, rf power is applied to the inactive gas to form a plasma therein which is applied to the coated body. In a sixth step, the coated body is then separated from the susceptor.

The invention will be better understood from the following more detailed description and claims taken with the accompanying drawings.

BRIEF DESCRIPTION OF THE DRAWINGS

The FIGURE of the drawing is a schematic sectional view of a plasma CVD apparatus in which a method in accordance with the present invention can be carried out.

The drawing is not necessarily to scale.

DETAILED DESCRIPTION

In a typical method of processing (i.e., coating) a body (substrate), such as of glass, silicon or other semiconductor material, with one or more layers by plasma CVD, the body is placed in a processing (deposition) chamber on a susceptor. The susceptor is generally of aluminum coated with a thin layer of aluminum oxide. A flow of a deposition gas or mixture of gases is admitted into the deposition chamber and an rf voltage is applied between an electrode and the susceptor which are spaced apart. The voltage provides rf power applied to the deposition gas which, at the pressure of the deposition gas, generates a plasma in the gas which causes the gas to react and deposit the desired layer on a surface of the body. In a typical embodiment, a power of between 0.15 and 0.8 watts/cm$^2$ is used to form the plasma in the deposition gas. The total power necessary to form the plasma is determined by the area of the electrode to which the voltage is applied to form the plasma. After the desired layer or layers are deposited on the body, the body is lifted off of the susceptor and removed from the deposition chamber.

In a method in accordance with the present invention, after the layer or layers are deposited on the body using the method described hereinabove, but before the body is lifted off of the susceptor, a flow of an inactive gas is provided in the deposition chamber. For the purpose of this invention, an inactive gas is defined as one which does not adversely affect the coatings on the body and which does not result in an additional coating(s) being applied to the body. Suitable gases typically include hydrogen ($H_2$), argon (Ar), nitrogen ($N_2$) and ammonia ($NH_3$). Rf power is applied to the inactive gas which causes the gas to generate a plasma therein. Preferably, the power is lower than that needed to form the plasma in the deposition gas, i.e., a power of less than 0.15 watts/cm$^2$ and preferably between about 0.03 and 0.14 watts/cm$^2$. The amount of time that the coated body is subjected to the plasma of the inert gas can be as little as two seconds, but is preferably between 5 and 15 seconds. Longer times are allowable. It has been found that once the coated body is subjected to the plasma of the inactive gas, the body can then be easily separated from the susceptor without the body sticking to the susceptor. Thus, the body is separated from the susceptor without causing the body to be broken or otherwise damaged. Once the body is separated from the susceptor, the rf power is turned off and the body can be removed from the deposition chamber.

It is believed that the plasma of the inactive gas causes a redistribution of the electrostatic charge on the susceptor and the body so as to limit forces holding them together. This reduces the sticking between the body and the susceptor and thus allows the body to be easily separated from the susceptor. The use of a lower power for generating the plasma in the inactive gas is preferred to limit the charge applied to the body during its exposure to the plasma of the inactive gas.

Referring now to the FIGURE of the drawing, there is shown a schematic sectional view of a plasma CVD apparatus 10 in which the method in accordance with the present invention can be carried out. Apparatus 10 comprises a deposition chamber 12 having a top wall 14 with an opening therethrough and a first electrode 16 within the opening. Alternatively, the top wall 14 can be solid with the electrode 16 being adjacent either an inner or outer surface of the top wall 14. Within the chamber 12 is a susceptor 18 in the form of a plate which extends parallel to the first electrode 16. The susceptor 18 is typically of aluminum and is coated with a layer of aluminum oxide. The susceptor 18 is connected to ground so that it serves as a second electrode. The susceptor 18 is mounted on the end of a shaft 20 which extends vertically through a bottom wall 22 of the deposition chamber 12. The shaft 20 is movable vertically so as to permit the movement of the susceptor 18 vertically toward and away from the first electrode 16. A lift-off plate 24 extends horizontally between the susceptor 18 and the bottom wall 22 of the deposition chamber 12 substantially parallel to the susceptor 18. Lift-off pins 26 project vertically upwardly from the lift-off plate 24. The lift-off pins 26 are positioned to be able to extend through holes 28 in the susceptor 18, and are of a length slightly longer than the thickness of the susceptor 18. Although there are only two lift-off pins 26 shown, there may be more of the lift-off pins 26 spaced around the liftoff plate 24. An outlet pipe 30 extends through a side wall 32 of the deposition chamber 12 and is connected to a vacuum pump (not shown) for evacuating the deposition chamber 12. An inlet pipe 34 also extends through another portion of the outer wall 32 of the deposition chamber 12 and is connected through a gas switching network (not shown) to sources (not shown) of various gases. The first electrode 16 is connected to an electrical power source 36. A transfer plate (not shown) is typically provided to carry substrate bodies through a load-lock door (not shown) and into the deposition chamber 12 and onto the susceptor 18, and to remove coated bodies from the deposition chamber 12.

In the operation of the deposition apparatus 10, a body 38 is fed into the deposition chamber 12 and is placed on the susceptor 18 by the transfer plate (not shown). The body 38 is of a size to extend over the holes 28 in the susceptor 18. The susceptor 18 is positioned above the lift-off plate 24 (as shown) by moving shaft 20 upward such that the lift-off pins 26 do not extend through the holes 28, and the susceptor 18 and body 38 are relatively close to the first electrode 16. The deposition chamber 12 is evacuated through the outlet pipe 30, and a deposition gas is fed into the deposition chamber 12 through the inlet pipe 34. The electrical power source 36 is turned on to provide rf power between the first electrode 16 and the susceptor 18 and through the deposition gas which is sufficient to generate a plasma in the deposition gas. The plasma causes the deposition gas to react and deposit a layer of a desired material on the surface of the body 38.

The composition of the deposition gas depends on the material to be deposited. For example, to deposit silicon nitride (SiN), a deposition gas comprising a mixture of silane ($SiH_4$), ammonia ($NH_3$), and nitrogen ($N_2$) is used. To deposit a layer of amorphous silicon, a deposition gas comprising a mixture of silane ($SiH_4$) and hydrogen ($H_2$) is used. To deposit silicon oxide ($SiO_2$), a deposition gas comprising a mixture of silane ($SiH_4$) and nitrous oxide ($N_2O$) can be used. Other gas combinations can be used for these and other materials to be deposited. During deposition a pressure of about 1.5 Torr is maintained in the deposition chamber 12 with the spacing between the first electrode 16 and the susceptor being typically between 500 and 1500 mils (12.5–40 mm). The power used for deposition is between typically about 0.15 and 0.8 watts/$cm^2$.

After the desired layer or layers are deposited on the surface of the body 38, the power is typically dropped to between 0.03 and 0.14 watts/$cm^2$. The flow of the deposition gas is turned off, and a flow of an inactive gas, such as hydrogen, nitrogen, argon or ammonia, is provided into the deposition chamber 12. Whether a gas is inactive may depend on the absence of other gases and the composition of the already deposited layer. As shown above, one of these inactive gases is often used as a carrier gas for the deposition gases. If an inactive gas is so used, it is then only necessary to stop the flow of the other deposition gases to provide a flow of only the inactive gas. The pressure in the deposition chamber is maintained at between 0.2 to 3.5 Torr. This generates a plasma in the inactive gas to which the coated substrate body 38 is subjected. Thus, the plasma is maintained while the gases are changed from the deposition gases to the inactive gas.

After about two seconds, and preferably about five seconds, of this treatment, the shaft 20 is moved downwardly to move the susceptor 18 and coated body 38 away from the first electrode 16 and toward the lift-off plate 24. During this movement of the body 38, the plasma is preferably maintained. As the susceptor 18 reaches the lift-off plate 24, the lift-off pins 26 extend through the holes 28 until they engage a bottom surface 38a of the body 38. Since the lift-off pins 26 are longer than the thickness of the susceptor 18, the lift-off pins 26 stop the downward movement of the body 38. Further downward movement of the susceptor 18 causes the separation of the body 38 from the susceptor 18. By treating the body 38 with the plasma of the inactive gas, sticking of the body 38 to the susceptor plate 18 is limited. Thus, the body 38 is relatively easily separated from the susceptor 18 without damage to the body 38. The flow of the inactive gas and the rf power can then be turned off, and the coated body 38 removed from the deposition chamber 12 by means of the transfer plate (not shown). Alternatively, the flow of the inactive gas can be turned off to discontinue the plasma of the inactive gas prior to lifting the body 38 from the susceptor 18.

In a typical embodiment of apparatus 10 shown in the FIGURE of the drawing, for flat-panel displays formed on a glass plate, the electrode 16 and susceptor 18 are each 38×48 cm. A glass plate is the body 38 and was transferred into the deposition chamber 12 and placed on the susceptor 18. The susceptor was moved upwardly until there was a spacing of 962 mils (24 mm) between the susceptor 18 and the electrode 16. A flow of a deposition gas consisting of silane, ammonia and nitrogen was provided into the deposition chamber 12 and a pressure of 1.2 Torr was provided in the chamber 12. The power source 36 to the electrode 16 was turned on and rf power of 600 watts was provided. This created a plasma in the deposition gas which caused the silane and ammonia to decompose and deposit a layer is silicon nitride on a surface of the glass plate.

After a layer of silicon nitride of the desired thickness was deposited, the power was decreased to 100 watts. The flow of the deposition gas was replaced with a flow of hydrogen and the pressure in the chamber was reduced to 0.2 Torr. The power which was now applied to the hydrogen gas caused a plasma to be formed in the hydrogen gas. The coated glass plate was subjected to the hydrogen gas plasma for 10 seconds. While still subjecting the coated glass plate to the hydrogen plasma, the susceptor 18 was moved away from the electrode 16 toward the lift-off plate 24. As the electrode 16 reached the lift-off plate 24, the lift-off pins 26 engaged the bottom surface of the glass plate and separated the glass plate from the susceptor. The flow of hydrogen was then stopped and the power turned off. The coated glass plate was then removed from the deposition chamber.

Thus, there is provided by the present invention a method of limiting sticking of a body to a susceptor in a plasma CVD apparatus. This allows for greater ease of removing the coated body from the susceptor without breaking or other damaging the body or the coatings thereon. The method of preventing the sticking of the body to the susceptor in accordance with the present invention uses some of the same gases that are used in the deposition steps and adds only a few seconds to the overall operation of the coating method. Also, if the layers deposited on the body form thin film transistors, it has been found that the method in accordance with the present invention for preventing sticking between the body and the susceptor also improved the electrical characteristics of the thin film transistors.

It is to be appreciated and understood that the specific embodiments of the invention are merely illustrative of the general principles of the invention. Various modifications may be made consistent with the principles set forth. For example, inactive gases other than those listed above may be used as long as they can form a plasma and do not adversely affect the layers deposited on the body and do not add any additional layers. Also, bodies of materials other than those listed above can be used, such as silicon wafers. In addition, the method in accordance with the present invention can be used in other types of plasma deposition chambers.

What is claimed is:

1. A method of limiting sticking of a body to a susceptor resulting from processing of a surface of the body by plasma processing while the body is mounted on the susceptor in a processing chamber, the method comprising the step of:

after the body is processed, subjecting the body to a plasma of a gas which does not chemically react with the processed surface on the body and which does not deposit a layer on the body.

2. The method of claim 1 further comprising the step of separating the body from the susceptor after the body is subjected to the plasma of the gas.

3. The method of claim 2 in which the gas is selected from the group consisting of hydrogen, nitrogen, argon and ammonia.

4. The method of claim 3 in which the plasma of the gas is formed by subjecting the gas to an rf power of between 0.03 and 0.14 watts/cm$^2$ times the area of an electrode spaced from the susceptor and to which a voltage is applied to form the plasma.

5. The method of claim 4 in which a pressure is provided in the processing chamber which is between 0.2 and 3.5 Torr.

6. The method of claim 5 in which the body is subjected to the plasma of the gas for a period of between about 2 and 15 seconds.

7. The method of claim 6 further comprising continuing to subject the body to the plasma of the gas while the body is being separated from the susceptor.

8. The method of claim 2 wherein the body is processed by subjecting it to a plasma of a processing gas.

9. The method of claim 8 wherein an essentially continuous plasma is maintained when the processing gas is changed to the gas.

10. A method of treating a body comprising the steps of:

placing the body on a susceptor within a deposition chamber having an electrode spaced from the susceptor;

flowing a deposition gas within the chamber;

applying a voltage across the electrode and the susceptor at a rf power which generates a plasma in the deposition gas so as to react the deposition gas and deposit a layer on a surface of the body;

discontinuing the flow of the deposition gas;

flowing a second gas into the chamber which second gas does not react with the layer on the body or the body and does not add another layer;

applying a rf power to the second gas to generate a plasma of the second gas which is applied to the body; and then separating the body from the susceptor.

11. The method of claim 10 in which the second gas is selected from the group consisting of hydrogen, nitrogen, argon and ammonia.

12. The method of claim 11 in which the plasma in the second gas is formed at a power less than that used to form the plasma of the deposition gas.

13. The method of claim 12 in which the second gas is subjected to an rf power of between 0.03 and 0.14 watts/cm$^2$ times the area of the electrode to which the voltage is applied to form the plasma.

14. The method of claim 13 in which a pressure is provided in the deposition chamber which is between 0.2 and 3.5 Torr.

15. The method of claim 14 in which the body is subjected to the plasma of the second gas for a period of 2 to 15 seconds.

16. The method of claim 15 in which the body is subjected to the plasma of the second gas for the period prior to separating the body from the susceptor.

17. The method of claim 16 further comprising continuing to subject the body to the plasma of the second gas while the body is being separated from the susceptor.

18. The method of claim 10 in which the plasma is maintained substantially continuously while changing from the deposition gas to the second gas which is an inert gas.

19. The method of claim 10 wherein the plasma is maintained essentially continuously when the deposition gas is changed to the second gas.

* * * * *